US011022645B2

(12) United States Patent
An et al.

(10) Patent No.: US 11,022,645 B2
(45) Date of Patent: Jun. 1, 2021

(54) SEMICONDUCTOR ELEMENT TEST DEVICE

(71) Applicant: PROWELL, Paju-si (KR)

(72) Inventors: Tae Yu An, Paju-si (KR); Seong Han Park, Cheonan-si (KR)

(*) Notice: Subject to any disclaimer, the term of this patent is extended or adjusted under 35 U.S.C. 154(b) by 38 days.

(21) Appl. No.: 16/734,426

(22) Filed: Jan. 6, 2020

(65) Prior Publication Data

US 2021/0132144 A1 May 6, 2021

(30) Foreign Application Priority Data

Nov. 5, 2019 (KR) .................. 10-2019-0140064

(51) Int. Cl.
*G01R 31/28* (2006.01)
*H01R 12/88* (2011.01)

(52) U.S. Cl.
CPC ......... *G01R 31/2887* (2013.01); *H01R 12/88* (2013.01)

(58) Field of Classification Search
CPC ...... G01R 1/0433–0466; G01R 1/0483; G01R 1/0408; H01R 12/88
See application file for complete search history.

(56) References Cited

U.S. PATENT DOCUMENTS

| | | | | |
|---|---|---|---|---|
| 5,074,798 A * | 12/1991 | Carter | .................. | H05K 7/1023 439/72 |
| 5,247,250 A * | 9/1993 | Rios | ..................... | H05K 7/1069 324/750.22 |
| 5,387,120 A * | 2/1995 | Marks | .................. | H05K 7/1023 439/331 |
| 6,512,388 B1 * | 1/2003 | Satoh | ................... | G01R 1/0433 324/755.05 |
| 8,847,618 B1 * | 9/2014 | Michalko | .......... | G01R 31/2818 324/756.02 |
| 2002/0055284 A1 * | 5/2002 | Ikeya | .................. | G01R 1/0483 439/67 |
| 2003/0173949 A1 * | 9/2003 | Hwang | ............. | G01R 31/2893 324/750.19 |
| 2004/0147153 A1 * | 7/2004 | Trout | .................... | H01R 12/88 439/342 |
| 2005/0181654 A1 * | 8/2005 | Watanabe | ............ | H01R 13/701 439/331 |
| 2006/0057747 A1 * | 3/2006 | Hemmerling | ........ | G01R 1/0483 438/15 |
| 2006/0068614 A1 * | 3/2006 | Harper | ................. | G01R 1/0466 439/70 |

(Continued)

*Primary Examiner* — Patrick Assouad
*Assistant Examiner* — Demetrius R Pretlow
(74) *Attorney, Agent, or Firm* — Jongkook Park

(57) ABSTRACT

The present invention provides a semiconductor element test device comprising a base whereon a semiconductor element for testing is to be placed and having a cover pivot shaft on one side thereof, a cover in which one side is coupled to the cover pivot shaft so as to be capable of hinge rotation, a movable latch installed on the other side of the base, and a cover latch installed on the other side of the cover so that a portion of the cover latch is coupled to the movable latch to allow the cover to be in a closed state, wherein the cover latch has a step formed on the coupling portion with the movable latch to adjust a gap between the cover and the base in a state where the cover is closed, thereby enabling the test of semiconductor elements having different heights.

6 Claims, 11 Drawing Sheets

(56) References Cited

U.S. PATENT DOCUMENTS

| | | | |
|---|---|---|---|
| 2007/0285106 A1* | 12/2007 | Henry | G01R 1/0408 324/555 |
| 2008/0265918 A1* | 10/2008 | Wooden | G01R 1/0466 324/754.12 |
| 2008/0280477 A1* | 11/2008 | Hsiao | H05K 7/1053 439/331 |
| 2009/0163051 A1* | 6/2009 | Miki | G01R 1/0466 439/68 |
| 2009/0230983 A1* | 9/2009 | Yoshida | G01R 1/0466 324/756.02 |
| 2009/0311913 A1* | 12/2009 | Koehler | G01R 1/0466 439/656 |
| 2010/0120265 A1* | 5/2010 | Nakamura | G01R 1/0466 439/65 |
| 2015/0171530 A1* | 6/2015 | Sano | G01R 1/0483 439/310 |
| 2015/0377924 A1* | 12/2015 | Hwang | G01R 31/2863 324/756.02 |
| 2016/0025775 A1* | 1/2016 | Chen | G01R 1/0433 324/756.02 |
| 2016/0154023 A1* | 6/2016 | Choi | G01R 1/0466 324/750.2 |
| 2021/0063442 A1* | 3/2021 | Tamaki | G01R 1/0408 |
| 2021/0066871 A1* | 3/2021 | Hachuda | H01L 23/32 |

* cited by examiner

SEMICONDUCTOR ELEMENT TEST DEVICE

CROSS-REFERENCE TO RELATED APPLICATIONS

This application claims priority under 35 U.S.C. § 119 to Korean Patent Application No. 10-2019-0140064, filed on Nov. 5, 2019, in the Korean Intellectual Property Office, the disclosure of which is incorporated herein by reference in its entirety.

TECHNICAL FIELD

The following disclosure relates to a semiconductor element test device.

BACKGROUND

The present disclosure relates to a device used for conducting an electrical test for a semiconductor element, and more particularly, to a semiconductor element test device capable of detachably receiving a semiconductor element such as an integrated circuit to form an electrical contact between a contact of the element and each contact point or terminal of the test device to then connect the contact point or the terminal of the test device to each contact pad of a circuit board. When a semiconductor element is loaded into a test device for testing, it is important that the cover remains closed during the test process.

In the related art, in the case of testing a plurality of elements having different heights, there has been a need to use separate semiconductor element test devices for each element, and thus efforts are being made to solve such problems.

SUMMARY

An embodiment of the present disclosure is directed to providing a semiconductor element test device capable of testing a plurality of elements by stroke control, even if the elements have different heights.

To resolve the above-mentioned problem, the present invention provides a semiconductor element test device comprising a base whereon a semiconductor element for testing is to be placed, and having a cover pivot shaft on one side thereof, a cover in which one side is hinged and rotatably coupled to the cover pivot shaft, a movable latch installed on the other side of the base, and a cover latch installed on the other side of the cover so that a portion of the cover latch may be coupled to the movable latch to allow the cover to be in a closed state, wherein the cover latch has a step formed on the portion which couples with the movable latch to adjust a gap between the cover and the base in a state where the cover is closed, thereby enabling the testing of semiconductor elements having different heights.

The cover latch may be capable of sliding to the other side of the cover so that the step of the portion coupling with the movable latch is adjusted differently.

The cover may comprise an upper cover coupled to the cover pivot shaft so as to be capable of hinge rotation, a lower cover coupled to the cover pivot shaft so as to be capable of hinge rotation, and a link in which one end is coupled to a side surface of the upper cover and the other end thereof is coupled to a side surface of the lower cover so as to be capable of hinge rotation, wherein the coupling point of the link and the upper cover may be closer to the cover pivot shaft than the coupling point of the link and the lower cover.

The lower cover may comprise a pusher connected to a central portion of the link and positioned on an upper portion of the semiconductor element to press on the semiconductor element when the cover is closed, wherein the pusher is pressed by both the lower cover and the link.

The movable latch may comprise a movable latch connection part installed on the other side of the base, a rachet in which one end is connected to the movable latch connection part so as to be capable of hinge rotation and fastened to the cover latch, a lever connected to the other end of the rachet so as to be capable of hinge rotation, and a safety pin unit coupled to the movable latch connection part to prevent the hinge rotation of the rachet when fastened with the rachet.

The safety pin unit may comprise a pin, a support member formed on an outer circumference of the pin, and a spring positioned between the support member and the rachet and surrounding the pin, wherein when the pin is in a contact state with the upper cover, the pin is pushed in the direction of the rachet by the upper cover, and thus the hinge rotation of the rachet is prevented.

BRIEF DESCRIPTION OF THE DRAWINGS

FIG. 4A is an enlarged view of the cover latch according to an embodiment of the present disclosure. FIG. 4B is an enlarged view of a portion showing a state where the movable latch is coupled to each of the different stepped portions of the cover latch.

DETAILED DESCRIPTION OF EMBODIMENTS

Hereinafter, a detailed description of the present prevention is provided, with reference to drawings illustrating embodiments of the present invention for demonstrating application of the characteristics of the invention which may be applied. However, it will be apparent to those skilled in the art that the following embodiments and examples are provided only to illustrate the present disclosure, various changes and modifications can be made within the spirit and the scope of the disclosure, and these variations and modifications are included within the scope of the appended claims.

Figure 1:
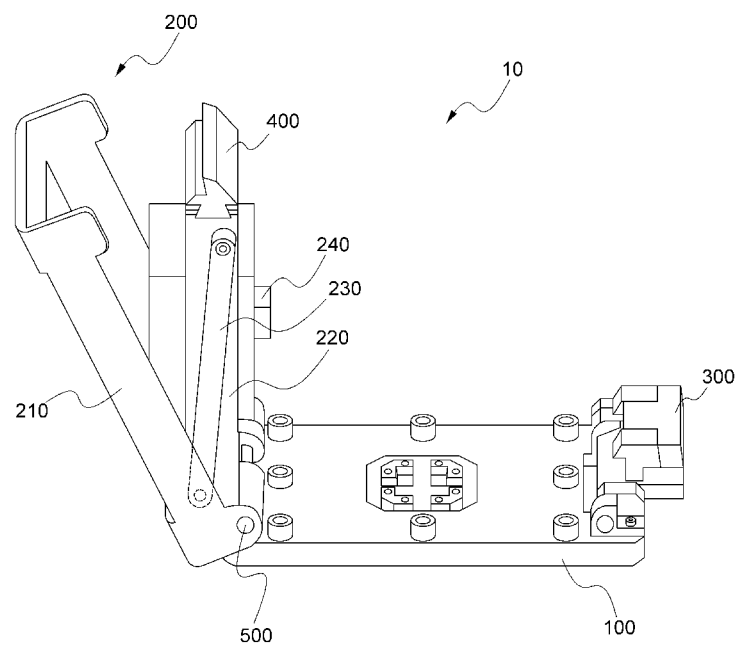
FIG. 1 is a perspective view of a state where a cover of a semiconductor element test device according to an embodiment of the present disclosure is open.

FIG. 1 is a perspective view of a state in which the cover 200 of a semiconductor element test device 10 according to an embodiment of the present disclosure is open.

With reference to FIG. 1, the semiconductor element test device 10 according to an embodiment of the present disclosure comprises a base 100, a cover 200, a movable latch 300, and a cover latch 400.

The base 100 may have a long rectangular side surface whereon a semiconductor element for testing may be placed on an upper portion of a central portion thereof, and a cover pivot shaft 500 on one side of the base. The cover pivot shaft 500 provided in the base may have a cylindrical shape to assist hinge rotation of the cover 200, as a shaft in which the cover 200 is capable of undergoing hinge rotation.

One side of the cover 200 is coupled to the cover pivot shaft 500 so as to be capable of hinge rotation. The cover 200 may have one or more holes having a shape that matches the shape (preferably a circular shape) of the cover pivot shaft 500 so as to be coupled to the cover pivot shaft 500 in a manner capable of hinge rotation.

The cover 200 comprises an upper cover 210 coupled to the cover pivot shaft 500 so as to be capable of hinge rotation, a lower cover 220 coupled to the cover pivot shaft 500 so as to be capable of hinge rotation, and a link 230 in which one end is coupled to a side surface of the upper cover 210 and the other end is coupled to a side surface of the lower cover 220 so as to be capable of hinge rotation.

With respect to the coupling of the link 230, a coupling point of the link 230 and the upper cover 210 may be closer to the cover pivot shaft 500 than a coupling point of the link 230 and the lower cover 220 in order to apply a greater load to the semiconductor element when the cover is closed, through application of the double-lever principle, which is one of the characteristics of the present disclosure.

The lower cover 220 includes a pusher 240 connected to a central portion of the link 230 and positioned on an upper portion of the semiconductor element to press the semiconductor element when the cover 200 is closed. The pusher 240 may be pressed by both the lower cover 220 and the link 230. This is called a double lever, and the principle of the double lever will be described in detail below with reference to the drawings.

The movable latch 300 is provided on the other side of the base 100. The movable latch 300 is similar in shape to the (Korean) letter 'ㄷ' when viewed from the side, and is coupled to a portion of the cover latch 400, to be described below, to allow the cover 200 to be in a closed state.

The cover latch 400 is provided on the other side of the lower cover 220. A portion of the cover latch 400 may be coupled to the movable latch 300, and thus the cover 200 may be in a closed state.

Figure 2:
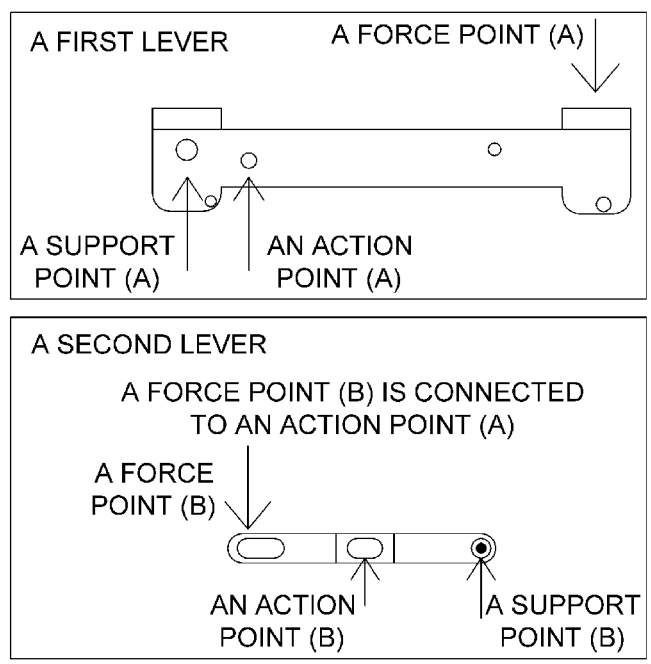
FIG. 2 is a drawing for explaining the double-lever principle when the cover of the present disclosure is closed.

FIG. 2 is a view for explaining the double-lever principle of when the cover 200 of the present disclosure is closed.

Referring to FIG. 2, when the cover 200 is closed, the pusher 240 is pressed by both the lower cover 220 and the link 230, and thereby comes to press the semiconductor element.

Referring to FIG. 2, firstly, a portion of the cover pivot shaft 500 becomes a support point, the other end of the upper cover 210 becomes a force point, and a portion where the link 230 and the upper cover 210 are connected becomes an action point, thereby forming a first lever. Referring to FIG. 2, secondly, the other end of the link 230 becomes a support point, one end of the link 230 becomes a force point, and the center portion becomes an action point, thereby forming a second lever.

That is, the load is to the pusher 240 is doubled by these two levers (double lever). In the case of the first lever, the force point is positioned on the right side in the drawing with respect to the action point and the support point is positioned on the left side in the drawing with respect to the action point, while in the case of the second lever, the force point is positioned on the left side in the drawing with respect to the support point and the support point is positioned on the right side in the drawing with respect to the action point; therefore, the force point and the action point of each lever are positioned in an opposite direction to the support point, and thus even when a small force is applied, a large load is applied to the pusher 240 by the double-lever principle, and this load is transmitted to the semiconductor element as is. Therefore, it is possible to apply a large load to the semiconductor element with only a small force.

Figure 3:
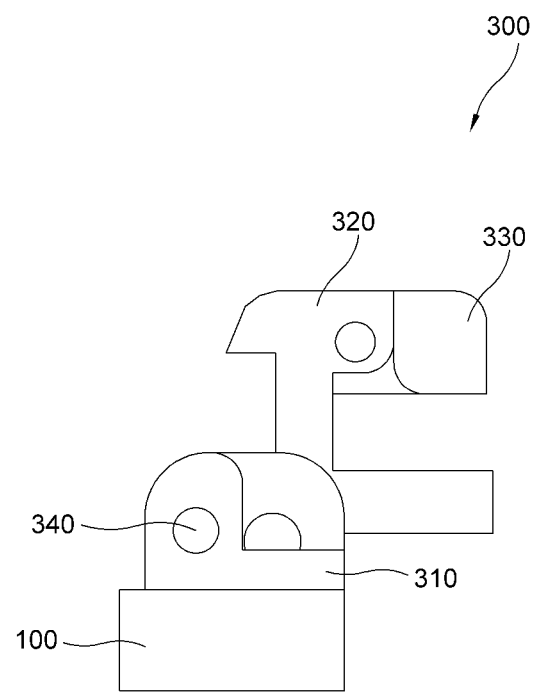
FIG. 3 is a side view of a movable latch according to an embodiment of the present disclosure.

FIG. 3 is a side view of the movable latch 300 according to an embodiment of the present disclosure. Referring to FIG. 3, the movable latch 300 comprises a movable latch connection part 310 installed on the other side of the base 100, a rachet 320 in which one end is connected to the movable latch connection part 310 so as to be capable of hinge rotation and fastened to the cover latch, a lever 330 connected to the other end of the rachet 320 so as to be capable of hinge rotation, and a safety pin unit 340 coupled to the movable latch connection part 310 to prevent the hinge rotation of the rachet 320 when fastened with the rachet 320.

Figure 4A:
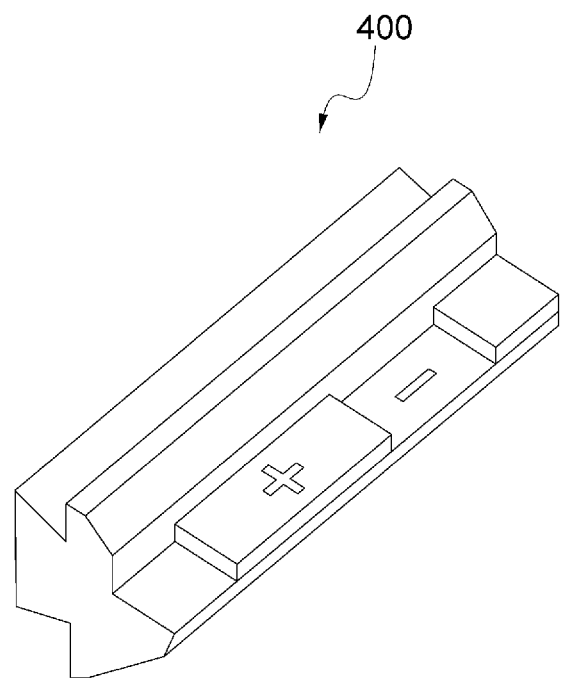
FIGS. 4A and 4B are drawings for explaining the coupling of the cover latch and the movable latch according to an embodiment of the present disclosure.
Figure 4B:
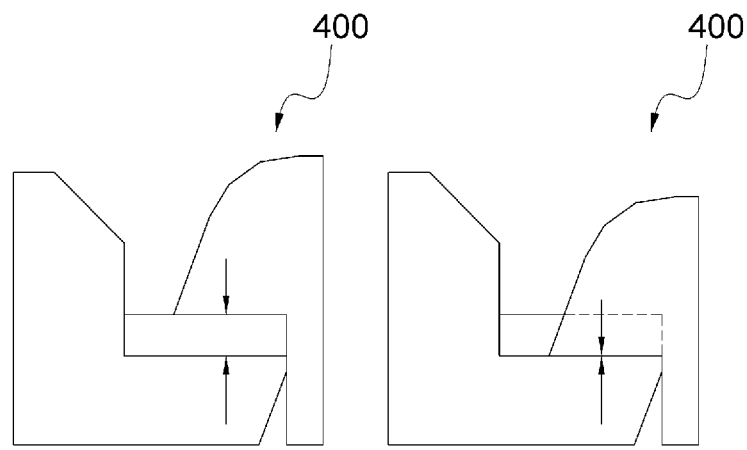

FIGS. 4A and 4B are diagrams for explaining coupling of the cover latch 400 and the movable latch 300. FIG. 4A is an enlarged view of the cover latch 400 according to an embodiment of the present disclosure. Referring to FIG. 4A, the cover latch 400 may have a step formed on the coupling portion with the movable latch 300. The part marked with (+) on the drawing has a relatively higher step than a part marked with (−), and the part marked with (−) on the drawing has a relatively lower step than the part marked with (+).

FIG. 4B is a partially enlarged view of a state where the movable latch 300 is coupled to each of the different stepped portions of the cover latch 200. Referring to FIG. 4B, the movable latch 300 may be coupled to each of the stepped portions of the cover latch 400. In other words, as shown in the left drawing of FIG. 4B, the movable latch may be coupled to the portion with a high step, and as shown in the right drawing of FIG. 4B, the movable latch may be coupled to the portion with a low step.

By the step formed through coupling as described above, the gap between the cover 200 and the base 100 may be adjusted depending on the height of the portion where the movable latch 300 is coupled to the cover latch 400 in a state where the cover 200 is closed. Therefore, it is easy to test semiconductor elements having different heights.

Figure 5A:
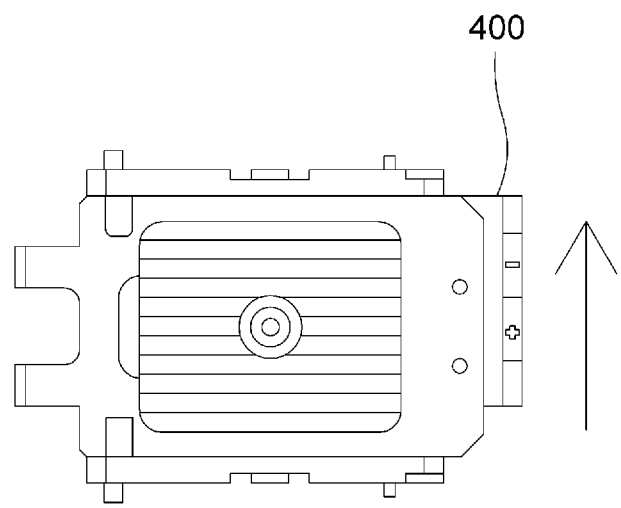
FIG. 5A and FIG. 5B are plane views of the cover according to an embodiment of the present disclosure.
Figure 5B:
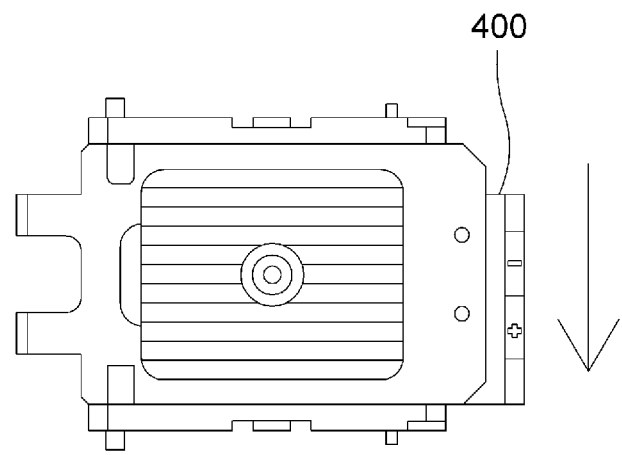

FIG. 5A and FIG. 5B are plane views of the cover 200 according to an embodiment of the present disclosure. Referring to FIG. 5, the cover latch 400 may be slidable to the other side of the cover 200 so that the step of the coupling portion with the movable latch 300 may be adjusted differently. According to this, whether the movable latch 300 will be coupled to the high stepped portion or the low stepped portion of the cover latch 400 may be determined according to the sliding of the cover latch 400. In other words, as shown in FIG. 5A, when the cover latch 400 is moved in the upward direction in the drawing, the movable latch 300 is coupled to the part marked with (+) on the cover latch 400. As shown in FIG. 5B, when the cover latch 400 is moved in the downward direction in the drawing, the movable latch 300 is coupled to the part marked with (−) on the cover latch 400.

Figure 6:
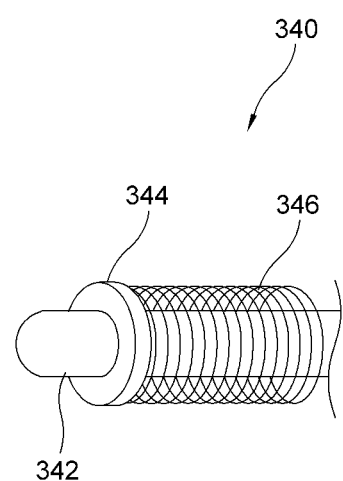
FIG. 6 is an enlarged view of a safety pin unit according to an embodiment of the present disclosure.

FIG. 6 is an enlarged view of the safety pin unit 340 according to an embodiment of the present disclosure. Referring to FIG. 6, the safety pin unit 340 comprises a pin 342, a support member 344 formed on an outer circumference of the pin 342, and a spring 346 positioned between the support member 344 and the rachet 320, surrounding the pin 342. Operation of the safety pin unit 340 will be described below in detail.

FIG. 7A, FIG. 7B, FIG. 7C, and FIG. 7D are partial cross-sectional views of the semiconductor element test device 10 according to an embodiment of the present disclosure, which is provided for explaining the operation of the safety pin unit 340 according to an embodiment of the present disclosure.

Figure 7A:
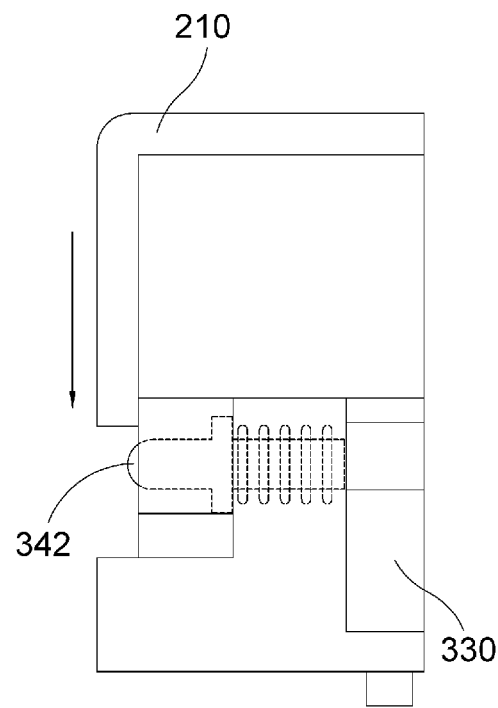
FIG. 7A, FIG. 7B, FIG. 7C, and FIG. 7D are partial cross-sectional views of the semiconductor element test device according to an embodiment of the present disclosure, which are provided for explaining operation of the safety pin unit according to an embodiment of the present disclosure.

Referring to FIG. 7A, as the upper cover 210 undergoes hinge rotation around the cover pivot shaft 500 in the direction in which the cover 200 is closed, the pin 342 comes to be in a contact state with the upper cover 210.

Figure 7B:
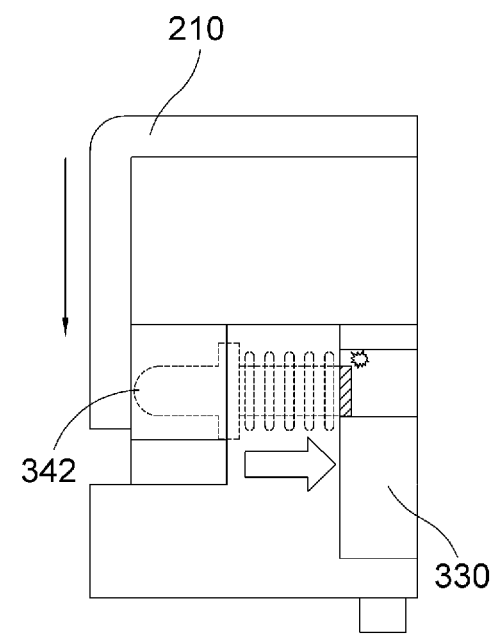

Referring to FIG. 7B, the pin 342 is pushed in the direction of the rachet 320 by the continued hinge rotation of the upper cover 210 after coming into contact with the upper cover 210, and becomes fastened with the rachet 320, thereby preventing the hinge rotation of the rachet 320. That is, it keeps the movable latch 300 from being moved. In this state, the spring 346 is in a compressed state as the support member 344 is pushed in the direction of the rachet 320.

Figure 7C:
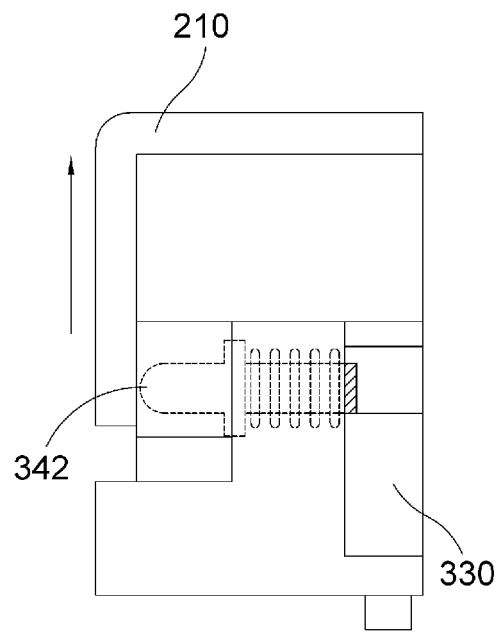

Referring to FIG. 7C, the upper cover undergoes hinge rotation around the cover pivot shaft 500 in a direction in which the cover 200 is opened.

Figure 7D:
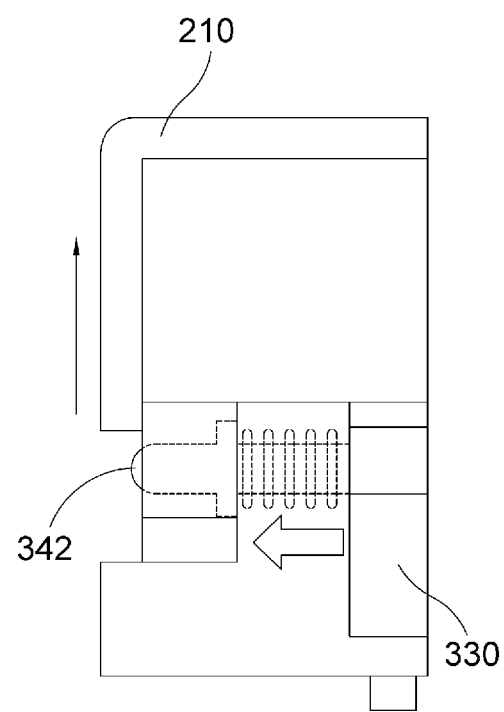

Referring to FIG. 7D, as the upper cover 210 undergoes hinge rotation around the cover pivot shaft 500 in a direction in which the cover 200 is opened, the pin 342 comes into state of non-contact with the upper cover 210. When the pin 342 is in a non-contact state with the upper cover 210, the cover 200 is returned to an open position by a restoring force of the spring 346. That is, hinge rotation of the rachet 320 becomes possible, and the movable latch 300 becomes capable of being moved.

FIG. 8A, FIG. 8B, FIG. 8C, FIG. 8D, and FIG. 8E illustrate that the semiconductor element test device 10 according to an embodiment of the present disclosure comes to be in a closed state for testing of a semiconductor element.

Figure 8A:
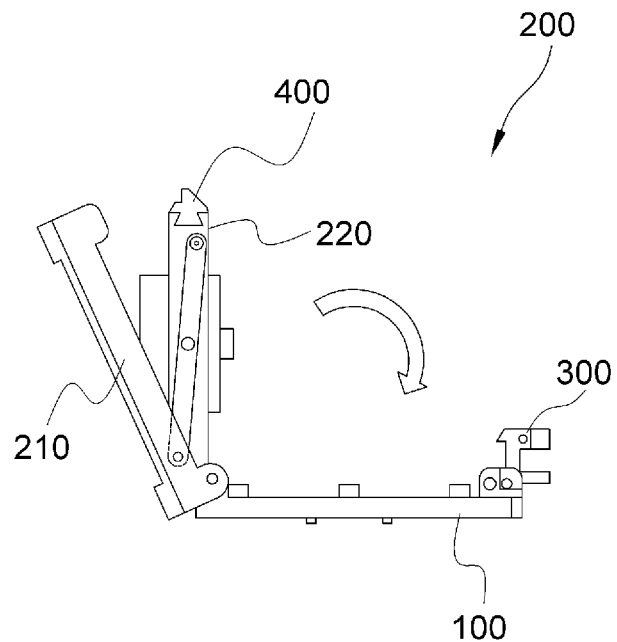
FIG. 8A, FIG. 8B, FIG. 8C, FIG. 8D, and FIG. 8E illustrate that the semiconductor element test device according to an embodiment of the present disclosure comes to be in a closed state for testing of a semiconductor element.

Referring to FIG. 8A, in order to bring the cover 200 into a closed state, the upper cover 210 first undergoes hinge rotation in the direction of the base 100. Then, the upper cover 210 pushes the lower cover 220 so that both the upper cover 210 and the lower cover 220 undergo hinge rotation in the direction of the base 100.

Figure 8B:
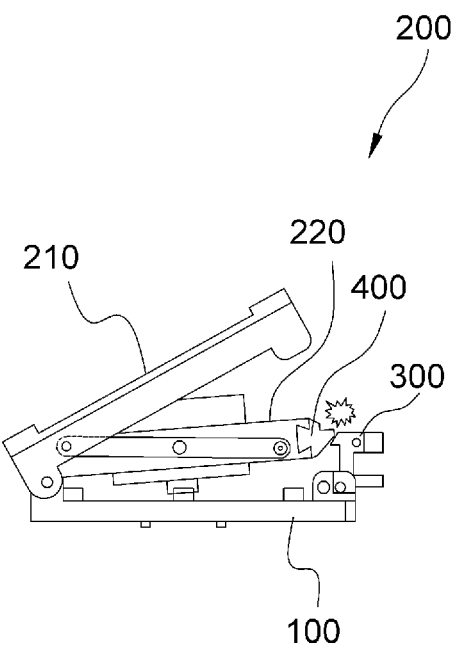

Referring to FIG. 8B, both the upper cover 210 and the lower cover 220 undergo hinge rotation in the direction of the base 100, and the cover latch 400 installed at the other end of the lower cover 220 is brought into contact with the movable latch 300 installed at the other end of the base 100.

Figure 8C:
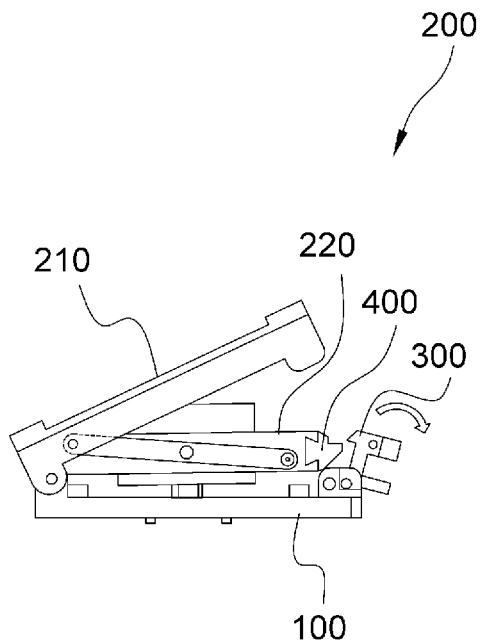

Referring to FIG. 8C, when the cover latch 400 is brought into contact with the movable latch 300, the movable latch 300 undergoes hinge rotation due to the pushing force, and thus space is created so that the cover latch 400 is capable of being rotated further in the direction of movement through hinge rotation.

Figure 8D:
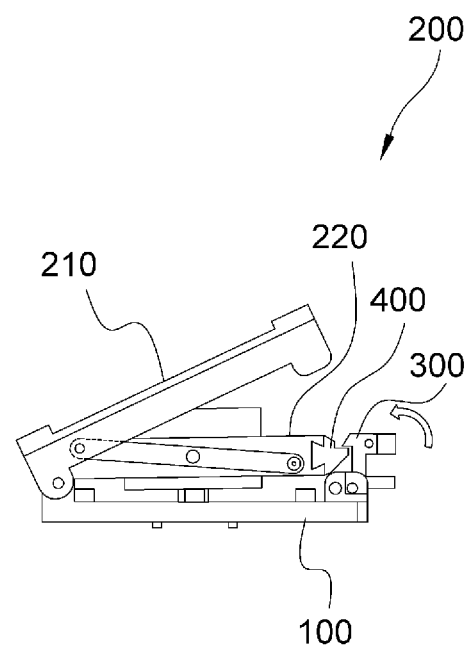

Referring to FIG. 8D, when the cover latch 400 moves to the space formed by the hinged rotation of the movable latch 300, the movable latch 300 returns to the position assumed prior to contacting the cover latch 400. A spring may be installed so that the movable latch 300 receives a force in the direction in which the movable latch 300 returns to the position assumed prior to contacting the cover latch 400, but the present disclosure is not limited thereto.

Figure 8E:
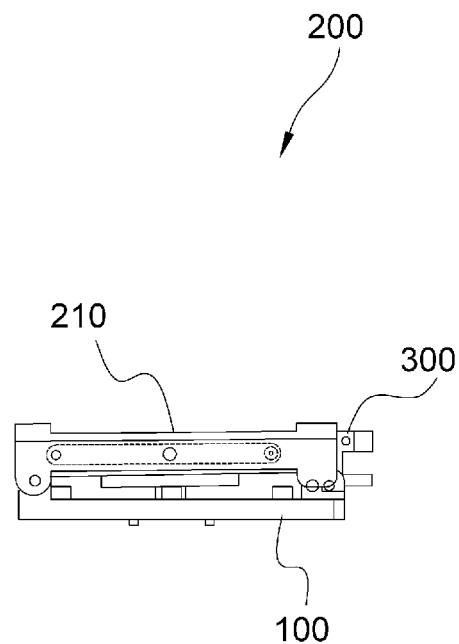

Referring to FIG. 8E, when the movable latch 300 returns to the position assumed prior to contacting the cover latch 400, the fastening of the cover latch 400 and the movable latch 300 is completed, and the cover 200 comes to be in a closed state. Here, a large load is applied to the pusher 240 by the double-lever principle, as described above.

FIG. 9A, FIG. 9B, FIG. 9C, and FIG. 9D illustrate the movement of the semiconductor element test device 10 according to an embodiment of the present disclosure from the closed state to an open state.

Figure 9A:
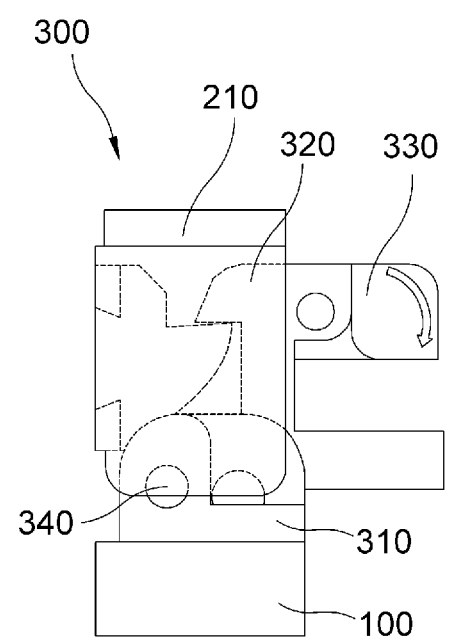
FIG. 9A, FIG. 9B, FIG. 9C, and FIG. 9D illustrate the semiconductor element test device according to an embodiment of the present disclosure moving from a closed state to an open state.

Referring to FIG. 9A, in order to move the semiconductor element test device 10 from the closed state to the open state, the lever 330 is first pressed in a direction of the arrow in the drawing. In this state, the pin 342 of the safety pin unit 340 prevents the hinge rotation of the rachet 320, as described above.

Figure 9B:
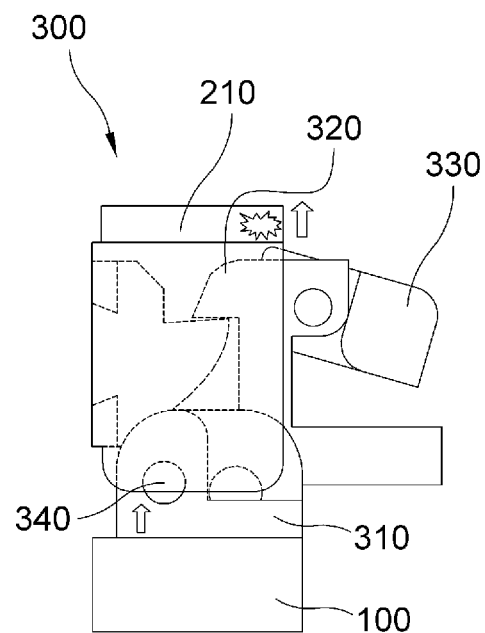

Referring to FIG. 9B, when the lever 330 is pressed in the direction of the arrow in the drawing, the lever 330 is undergoes hinge rotation around the other end of the rachet 320, and one end of the lever 330 is brought into contact with the upper cover 210. Through contact of the one end of the lever 330, the upper cover 210 is forced upward, and undergoes hinge rotation around the cover pivot shaft 500.

Figure 9C:
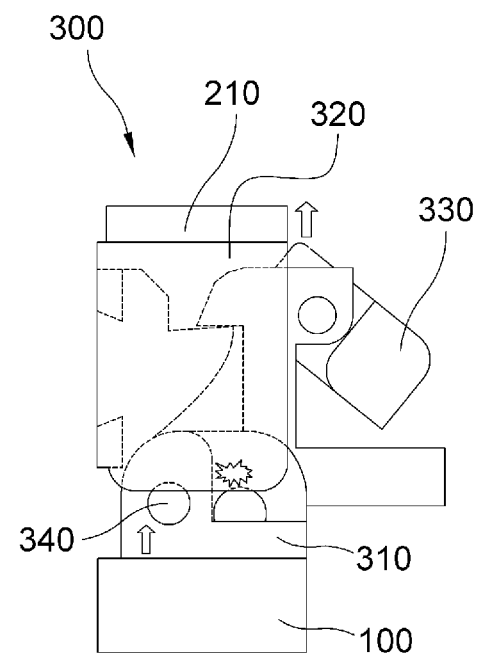

Referring to FIG. 9C, as the upper cover 210 is hinge rotated in the opening direction of the cover 200, the pin 342 returns to the position where the cover 200 is opened, as described above.

Figure 9D:
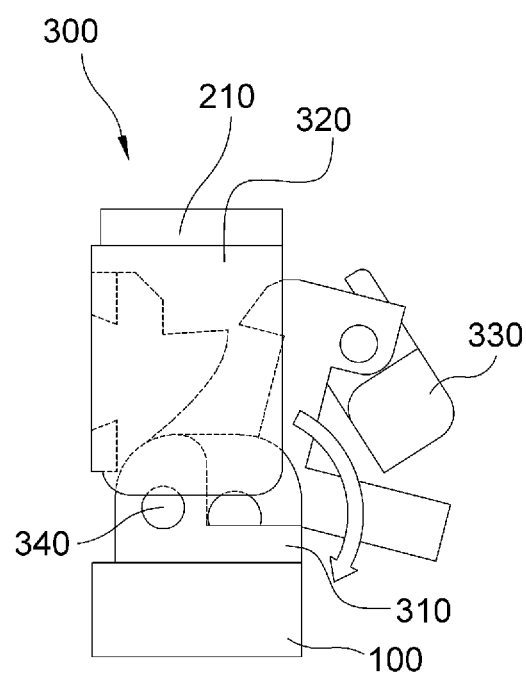

Referring to FIG. 9D, as the pin 342 returns to the position where the cover 200 is opened, the rachet 320 undergoes hinge rotation, and as a result, the movable latch 300 and the cover latch 400 are separated and the cover 200 is opened.

Therefore, according to the present disclosure, it is possible to apply a large load to the semiconductor element with only a small force through the double-lever principle, to use only two strokes to simply move the cover latch from side to side, and to easily prevent the movable latch from moving during the test by employing the safety pin. Moreover, since the semiconductor element test device 10 is opened and closed in one direction, it is easy to operate the device.

What is claimed is:

1. A semiconductor element test device comprising:
    a base whereon a semiconductor element for a test is to be placed, and having a cover pivot shaft on one side thereof,
    a cover in which one side is coupled to the cover pivot shaft so as to be capable of hinge rotation,
    a movable latch installed on the other side of the base, and
    a cover latch installed on the other side of the cover so that a portion of the cover latch is coupled to the movable latch to allow the cover to be in a closed state,
    wherein the cover latch has a step formed on the coupling portion with the movable latch to adjust a gap between the cover and the base in a state where the cover is closed, thereby conducting a test for a semiconductor element having different heights.

2. The semiconductor element test device of claim 1, wherein the cover latch is slidable to the other side of the cover so that the step of the coupling portion with the movable latch is adjusted differently.

3. The semiconductor element test device of claim 2, wherein the cover comprises:
an upper cover coupled to the cover pivot shaft so as to be capable of hinge rotation,
a lower cover coupled to the cover pivot shaft so as to be capable of hinge rotation,
and a link in which one end of the link is coupled to a side surface of the upper cover and the other end thereof is coupled to a side surface of the lower cover so as to be capable of hinge rotation,
wherein a coupling point of the link and the upper cover is closer to the cover pivot shaft than a coupling point of the link and the lower cover.

4. The semiconductor element test device of claim 3, wherein the lower cover comprises a pusher connected to a central portion of the link and positioned on an upper portion of the semiconductor element to press the semiconductor element when the cover is closed, wherein the pusher is pressed by both the lower cover and the link.

5. The semiconductor element test device of claim 3, wherein the movable latch comprises:
a movable latch connection part installed on the other side of the base,
a rachet in which one end is connected to the movable latch connection part so as to be capable of hinge rotation and fastened to the cover latch,
a lever connected to the other end of the rachet so as to be capable of hinge rotation, and
a safety pin unit coupled to the movable latch connection part to prevent the hinge rotation of the rachet when fastened with the rachet.

6. The semiconductor element test device of claim 5, wherein the safety pin unit comprises:
a pin, a support member formed on an outer circumference of the pin, and a spring positioned between the support member and the rachet and surrounding the pin,
wherein when the pin is in a contact state with the upper cover, the pin is pushed in a direction of the rachet by the upper cover, and thus the hinge rotation of the rachet is prevented.

* * * * *